(12) United States Patent
Cook Lobo et al.

(10) Patent No.: US 11,574,695 B1
(45) Date of Patent: Feb. 7, 2023

(54) LOGIC BUILT-IN SELF-TEST OF AN ELECTRONIC CIRCUIT

(71) Applicant: International Business Machines Corporation, Armonk, NY (US)

(72) Inventors: Alejandro Alberto Cook Lobo, Stuttgart (DE); Thomas Gentner, Boeblingen (DE); Michael B. Kugel, Boeblingen (DE); Otto Andreas Torreiter, Leinfelden-Echterdingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/388,103

(22) Filed: Jul. 29, 2021

(51) Int. Cl.
*G11C 29/16* (2006.01)
*G06F 11/27* (2006.01)
*G01R 31/3177* (2006.01)
*G11C 29/44* (2006.01)

(52) U.S. Cl.
CPC .......... *G11C 29/16* (2013.01); *G01R 31/3177* (2013.01); *G06F 11/27* (2013.01); *G11C 29/44* (2013.01)

(58) Field of Classification Search
None
See application file for complete search history.

(56) References Cited

U.S. PATENT DOCUMENTS

| | | | |
|---|---|---|---|
| 1,074,679 A | * | 10/1913 | Cook Lobo ............ B01D 29/27 210/451 |
| 7,340,496 B2 | | 3/2008 | Burdine |
| 7,802,159 B1 | | 9/2010 | Chakravarty |
| 8,461,865 B2 | | 6/2013 | Schlagenhaft |
| 9,766,289 B2 | | 9/2017 | Parasrampuria |
| 9,923,579 B2 | * | 3/2018 | Fee ........................ G11C 29/42 |

(Continued)

FOREIGN PATENT DOCUMENTS

| | | | |
|---|---|---|---|
| CN | 112181896 A | 1/2021 | |
| JP | 2008082888 A | 4/2008 | |
| WO | WO-2015119541 A1 | * 8/2015 | ....... G01R 31/31813 |

OTHER PUBLICATIONS

Amyeen et al., "Logic BIST Silicon Debug and Volume Diagnosis Methodology", ResearchGate, Conference Paper in IEEE International Test Conference (TC), Sep. 2011, DOI: 10.1109/TEST.2011.6139147, 11 pages.

(Continued)

*Primary Examiner* — Cynthia Britt
*Assistant Examiner* — Matthew W Wahlin
(74) *Attorney, Agent, or Firm* — Jared L. Montanaro (57) ABSTRACT

A tool for performing a logic built-in self-test of an electronic circuit operating on a clock cycle basis. The tool stores a configurable test signature in a random-access memory together with a pattern counter for a test pattern, wherein a number of the at least one additional signature register corresponds to a number of entries in the random access memory. The tool determines an error based, at least in part, on a compare operation for a given test pattern, wherein the compare operation determines whether the test signature in the first signature register before a capture cycle of a next test pattern differs from the corresponding configurable test signature. The tool stores the error in a corresponding additional signature register.

20 Claims, 9 Drawing Sheets

(56) References Cited

U.S. PATENT DOCUMENTS

| | | |
|---|---|---|
| 10,746,790 B1 | 8/2020 | Cook Lobo |
| 2002/0188903 A1 | 12/2002 | Chu |
| 2004/0003329 A1* | 1/2004 | Cote .............. G01R 31/318566 |
| | | 714/726 |
| 2009/0089636 A1 | 4/2009 | Fernsler |
| 2010/0229060 A1* | 9/2010 | Mrugalski ...... G01R 31/318547 |
| | | 714/E11.155 |
| 2011/0221469 A1 | 9/2011 | Schlagenhaft |
| 2012/0124440 A1 | 5/2012 | Gorti |
| 2012/0159274 A1 | 6/2012 | Balakrishnan |
| 2014/0149814 A1 | 5/2014 | Al-Omari |
| 2016/0349314 A1 | 12/2016 | Dubrova |
| 2018/0238962 A1 | 8/2018 | Kusko |

OTHER PUBLICATIONS

"Patent Cooperation Treaty International Search Report", Applicant's or agent's file reference P202000245PCT01, International application No. PCT/IB2022/056834, International dated Jul. 25, 2022, 8 pgs.

* cited by examiner

LOGIC BUILT-IN SELF-TEST OF AN ELECTRONIC CIRCUIT

BACKGROUND OF THE INVENTION

The present invention relates generally to data processing systems, and more particularly to performing a logic built-in self-test of an electronic circuit operating on a clock cycle basis.

Logic Built-in Self-Test (LBIST) is a mature cost-effective solution for semiconductor testing. LBIST is also applied during system tests, which are operated in the field to ensure system safety and reliability. Procedures to debug or diagnose the application of LBIST support a wide range of test goals like, for example, post-silicon validation, wafer and chip test, as well as system test.

Many diagnostic procedures for LBIST can be used in fabrication or even in-system. LBIST may be used in first silicon analysis or system bring up and debug, where the objective is not only logic diagnosis but also to troubleshoot any potential issue with the test (configuration problems, fencing, clocking, etc.). LBIST is a multi-cyclic self-test. A failing cycle is typically identified by using binary search algorithms.

SUMMARY

Aspects of an embodiment of the present invention disclose a method, computer program product, and apparatus for performing a logic built-in self-test of an electronic circuit operating on a clock cycle basis, wherein the electronic circuit comprises one or more scan chains connected to a multiple input signature register, wherein the multiple input signature register generates test signatures in a first signature register utilizing test patterns generated as input for the one or more scan chains, and a test controller that provides control signals to and receives control signals from the first signature register. The method includes storing, by one or more computer processors, a configurable test signature in a random-access memory together with a pattern counter for a test pattern, wherein a number of the at least one additional signature register corresponds to a number of entries in the random access memory. The method further includes determining, by the one or more computer processors, an error based, at least in part, on a compare operation for a given test pattern, wherein the compare operation determines whether the test signature in the first signature register before a capture cycle of a next test pattern differs from the corresponding configurable test signature. The method further includes storing, by the one or more computer processors, the error in a corresponding additional signature register.

The apparatus includes a random-access memory, at least one additional signature register, and a logic circuitry. The apparatus includes a configurable test signature that is stored in the random-access memory together with a pattern counter for a test pattern, wherein a number of the at least one additional signature register corresponds to a number of entries in the random access memory. The logic circuitry is further connected to outputs of the first signature register and to inputs of the at least one additional signature register. The logic circuitry is configured to determine an error by performing a compare operation for a given test pattern, the compare operation identifying that the test signature in the first signature register before a capture cycle of a next test pattern differs from the corresponding configurable test signature. The logic circuitry is configured to store the error in a corresponding additional signature register.

The computer program product includes program instructions to store a configurable test signature in a random-access memory together with a pattern counter for a test pattern, wherein a number of the at least one additional signature register corresponds to a number of entries in the random access memory. The computer program product further includes program instructions to determine, an error based, at least in part, on a compare operation for a given test pattern, wherein the compare operation determines whether the test signature in the first signature register before a capture cycle of a next test pattern differs from the corresponding configurable test signature. The computer program product further includes program instructions to store the error in a corresponding additional signature register.

DETAILED DESCRIPTION

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

The illustrative embodiments described herein provide an apparatus for performing a logic built-in self-test of an electronic circuit operating on a clock cycle basis, the electronic circuit comprising multiple scan chains connected to a first multiple input signature register adapted to generate test signatures in the first signature register from test patterns automatically generated as input for the scan chains and a test controller providing to and receiving from the first signature register control signals. The apparatus comprises a random access memory, at least one second signature register, and a logic circuitry, wherein a configurable test signature is stored in the random access memory together with a pattern counter for a test pattern, wherein a number of second signature registers corresponds to at least a number of entries in the random access memory.

The logic circuitry is further connected to the outputs of the first signature register and to the inputs of the second signature register.

The logic circuitry is adapted to determine by a compare operation for a given test pattern whether the test signature in the first signature register before a capture cycle of a next test pattern differs from the corresponding configurable signature, and in that case: (i) to identify an error by performing the compare operation for the test signature in the first signature register and the corresponding configurable signature, to store the error in the corresponding second signature register in case the test signature in the first signature register before the capture cycle of the next test pattern differs from the corresponding configurable signature; and (v) to repeat the procedure until all test patterns have been applied. When the test signature in the first signature register differs from the corresponding configurable signature, there is no match between the signatures.

The illustrative embodiments may further include a method for performing a logic built-in self-test of an electronic circuit operating on a clock cycle basis, the electronic circuit comprising multiple scan chains connected to a first multiple input signature register adapted to generate test signatures in the first signature register from test patterns automatically generated as input for the scan chains and a test controller providing to and receiving from the first signature register control signals, the apparatus comprising: a random access memory, at least one second signature register, and a logic circuitry, wherein a configurable test signature is stored in the random access memory together with a pattern counter for a test pattern, wherein a number of second signature registers corresponds to at least a number of entries in the random access memory.

The logic circuitry is further connected to the outputs of the first signature register and to the inputs of the second signature register.

The method at least comprises determining for a given test pattern whether the test signature in the first signature register before a capture cycle of a next test pattern differs from the configurable signature, and in that case: (i) identifying an error by performing the compare operation for the test signature in the first signature register and the corresponding configurable signature, (ii) storing the error in the corresponding second signature register in case the test signature in the first signature register before the capture cycle of the next test pattern differs from the corresponding configurable signature; and (iii) repeating the procedure until all test patterns have been applied.

An embodiment of the invention includes a debug feature used in VLSI chip test and characterization and/or in system field fail diagnostics.

Existing LBIST engines identify the first logic failure and keep the failing signature in a MISR (Multiple Input Signature Register).

An embodiment of the invention masks off one specific fail event only and keeps all logic circuits involved in LBIST. It can be seamlessly integrated into prior art debug methods like an aperture test. A mathematical method is used to subtract the previous failure from the current one, which is possible as the MISR compression and feedback algorithm is based on a mathematical calculation which is linear and allows super positioning.

As a first signature register a so-called STUMPS MISR (Self-Test Using MISR and PRPG) may be implemented, which uses a Pseudo-Random Pattern Generator (PRPG) for generating the test patterns. At the end of the logic test, the first signature register contains the potential failure combined with the configured or expected signature, while a second signature register contains just the potential failure. A second failure would be identified then by running the LBIST again in a binary search mode and monitoring the result of a compare operation between the duplicated second signature register and the first signature register at the end of test. As the compare operation preferably an XOR (exclusive OR) operation may be used.

If the result equals the original signature expected, no further failure occurred. If it is different another failure occurred. A configured signature or externally calculated error bits may also need to be injected in the correct cycle into the second signature register reserved for the second failure. Applying such a process allows to keep exactly one failure in one second signature register with feedback logic running in a loop. As a result, this second signature register continues testing including exactly one failure overlay in the signature.

Subsequent failures in a close area will no longer overlay in the failing signature. Thus it is possible to isolate those from the previous failures.

A configured signature may be extracted from a reference chip or from the same chip at a different testing condition or from logic simulation. The extraction can be made at a different time than the test execution. It may be preferred to extract the configured signature always after a new failure is found and captured and before a subsequent failure can be found.

Embodiments of the invention thus provide an unintrusive procedure for LBIST debug, where test signatures are sampled at predefined positions in the test sequence (checkpoints) and any captured error is processed independently until the end of the test application. After test application the observed signature may be reconstructed by aggregating the collected faulty signatures.

Embodiments of the invention assist test engineers in analyzing not only the first failure but also any other failure in the test sequence. This is unintrusive since it does not disturb the regular test application process and does not require any fault simulation or detailed knowledge of the design-for-test infrastructure of the chip.

Figure 1:
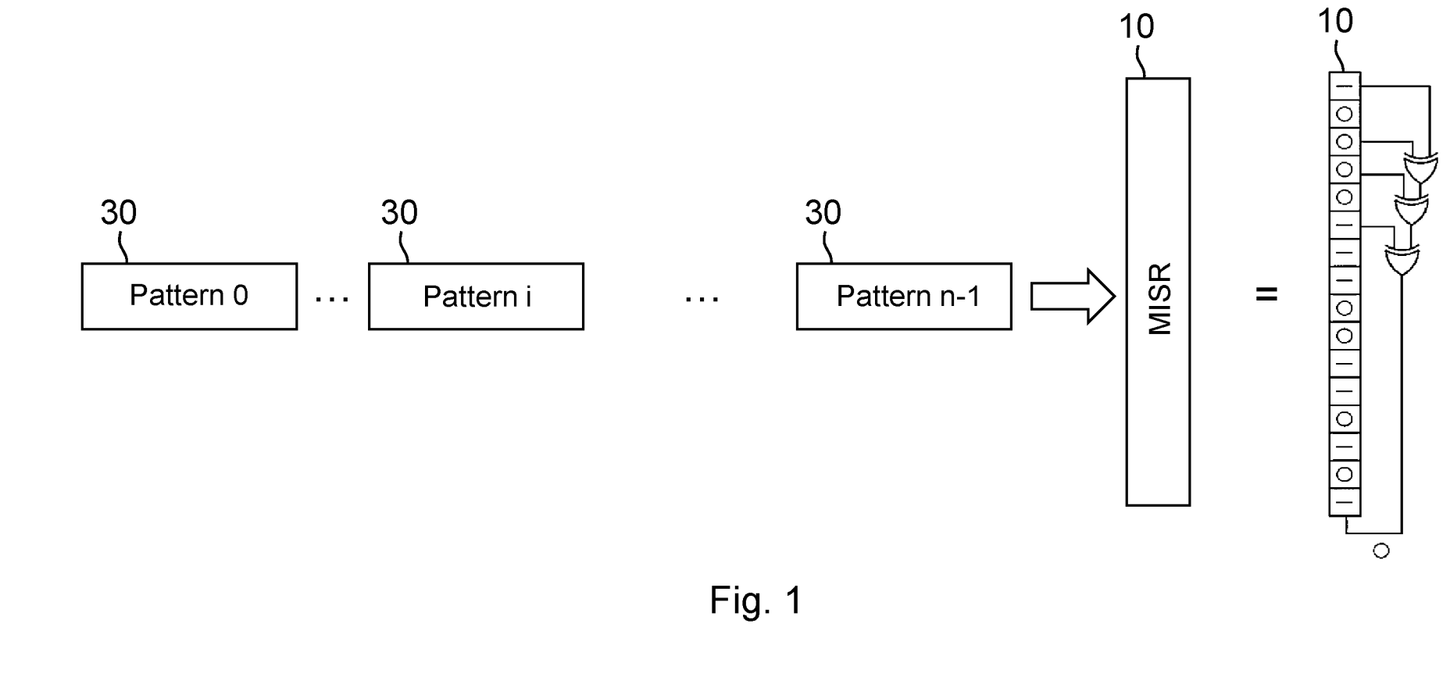
FIG. 1 depicts a first multiple input signature register compacting test patterns according to an embodiment of the invention.

FIG. 1 depicts a first multiple input signature register 10 compacting test patterns 30 according to an embodiment of the invention. A number of n test patterns 30 may be used for input to the signature register 10. On the right hand side of the Figure an implementation of the first signature register 10 is depicted.

The first signature register 10 as well as second signature registers 12 (shown in FIGS. 4 and 5) may be configured to generate test signatures 40 from automatically generated test patterns 30 by implementing a linear function depending on its generator polynomial for a given number of clock cycles, delivering an output for a given input: output=(input), where m is a number of clock cycles.

An example of the linear function may be:

$$L^{10}(s_0)=L^4(L^6(s_0))=L^{10}(s_a+s_b)=L^{10}(s_a)+L^{10}(s_b)\Sigma s_a,$$
$$s_b|s_a+s_b=s_0$$

This example represents the state of the signature register 10 after 10 cycles with an initial state $s_0$.

Figure 2:
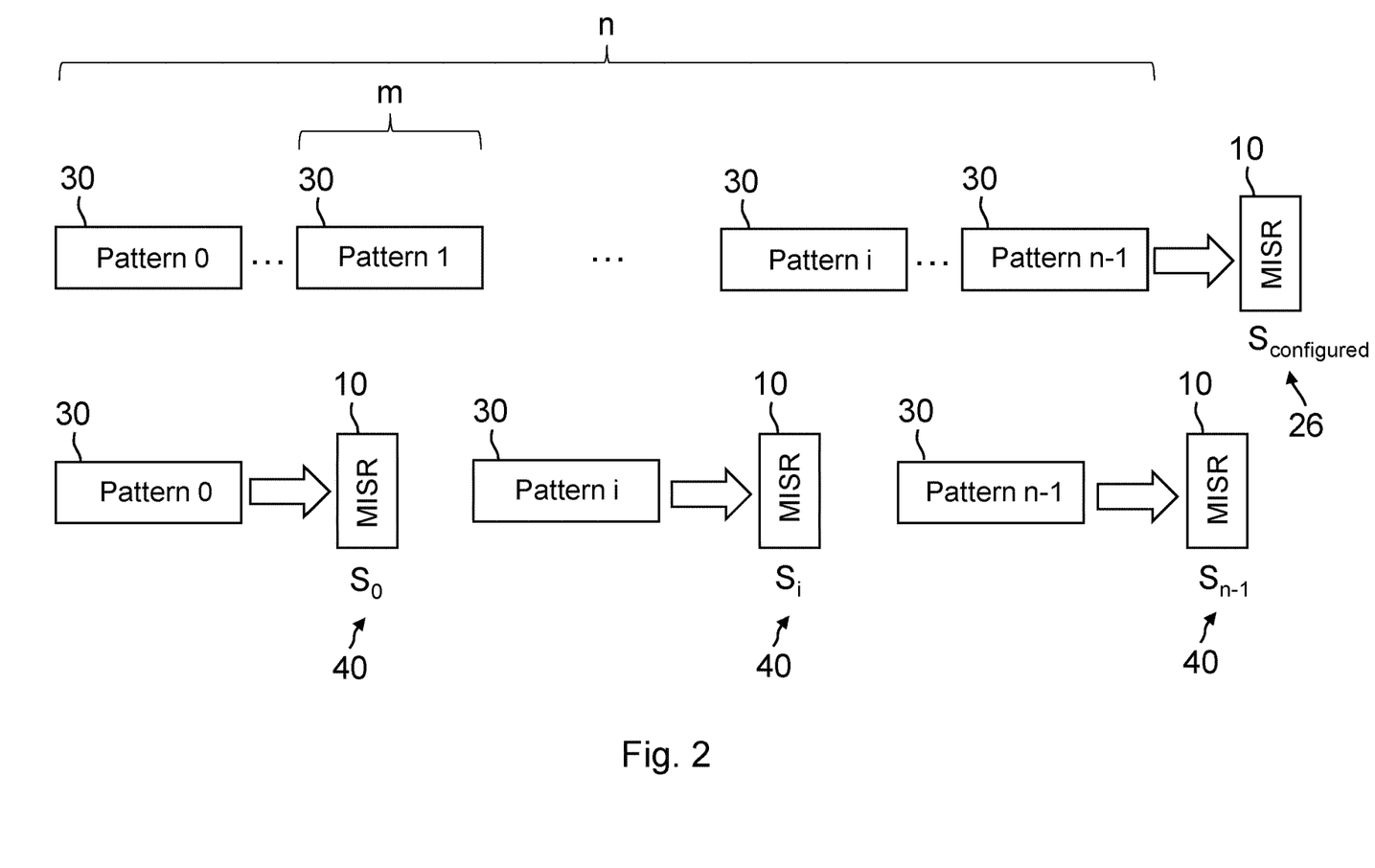
FIG. 2 depicts an on-chip test result compaction process according to an embodiment of the invention.

FIG. 2 depicts an on-chip test result compaction process according to an embodiment of the invention.

The upper part of the Figure shows a number of n test patterns 30 to be compacted to a configured signature 26 $s_{configured}$ in the first signature register 10. A scan chain length where the test patterns 30 are fed to comprises m clock cycles.

In the lower part of the Figure the process is depicted assuming that each test pattern 30 is compacted independently for generating the test signatures 40 $s_0$, $s_i$, $s_{n-1}$. Thus the configured signature 26 may be calculated as $$s_{configured} = s_0 + L^{1*m}(s_1) + L^{2*m}(s_2) + \ldots + L^{i*m}(s_i) + \ldots + L^{(n-1)*m}(s_{n-1})$$

where m is the number of clock cycles and n is the number of test patterns 30.

Figure 3:
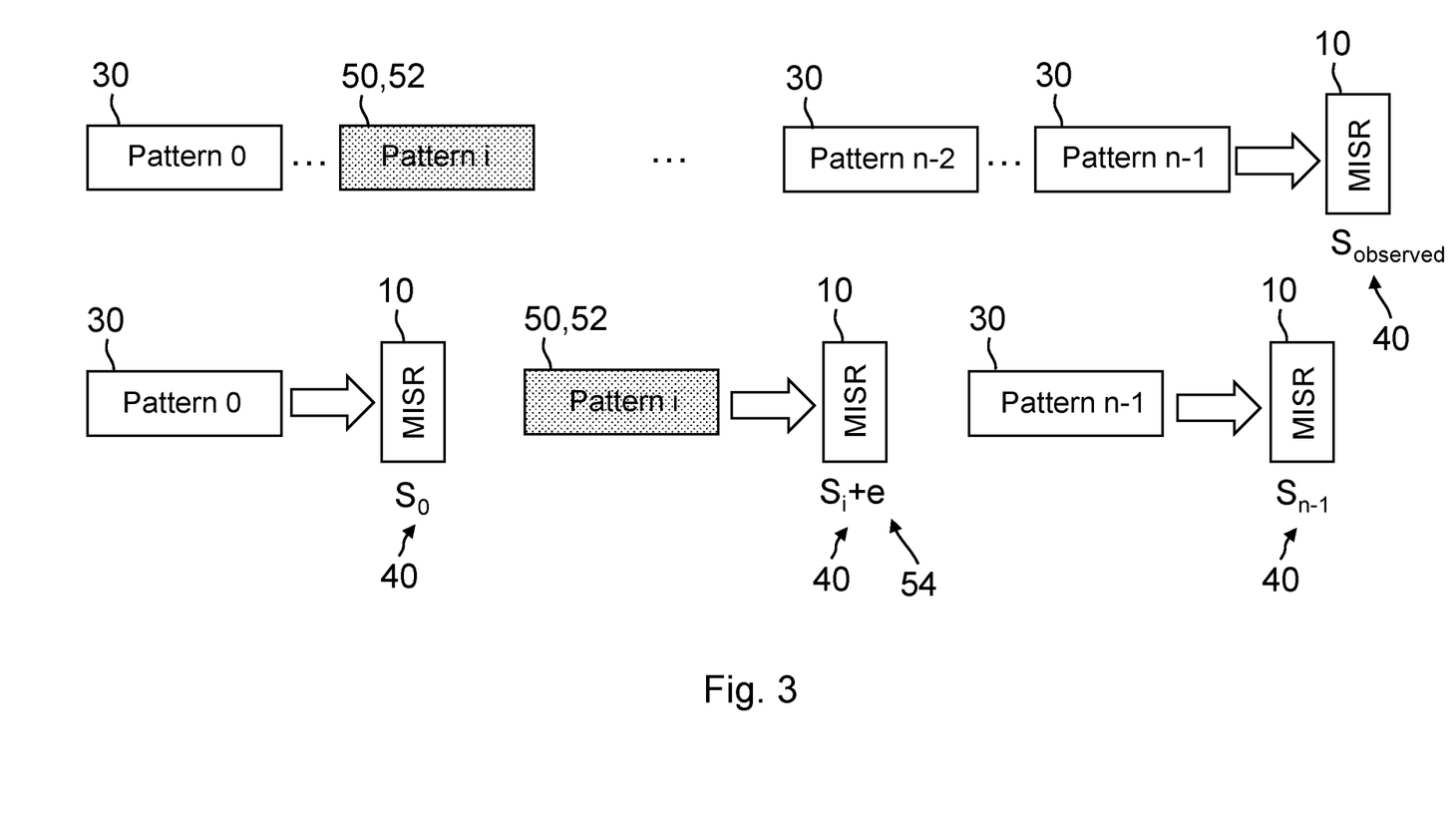
FIG. 3 depicts a symbolic representation of a compaction process of a failing test pattern according to an embodiment of the invention.

FIG. 3 depicts a symbolic representation of a compaction process of a failing test pattern 50, 52 according to an embodiment of the invention.

The upper part of the Figure shows a number of n test patterns 30, 50, 52 to be compacted to an observed signature 40 $s_{observed}$ in the first signature register 10. The test pattern 50, 52 with the pattern count i is assumed to be failing.

In the lower part of the Figure the process is depicted assuming that each test pattern 30, 50, 52 is compacted independently for generating the test signatures 40 $s_0$, $s_{i+e}$, $s_{n-1}$. Thus the observed signature 40 may be determined as $$s_{observed} = s_0 + L^{1*m}(s_1) + L^{2*m}(s_2) + \ldots + L^{i*m}(s_i + e) + \ldots + L^{(n-1)*m}(s_{n-1})$$

$$s_{observed} = s_0 + L^{1*m}(s_1) + L^{2*m}(s_2) + \ldots + L^{i*m}(s_i) + L^{i*m}(e) + \ldots + L^{(n-1)*m}(s_{n-1})$$

$$s_{observed} = s_{configured} + L^{i*m}(e)$$

Once the error 54 e in the corresponding test pattern 50, 52 with pattern count i is known, $L^{i*m}(e)$ may be determined which depends only on the error 54 e.

Figure 4:
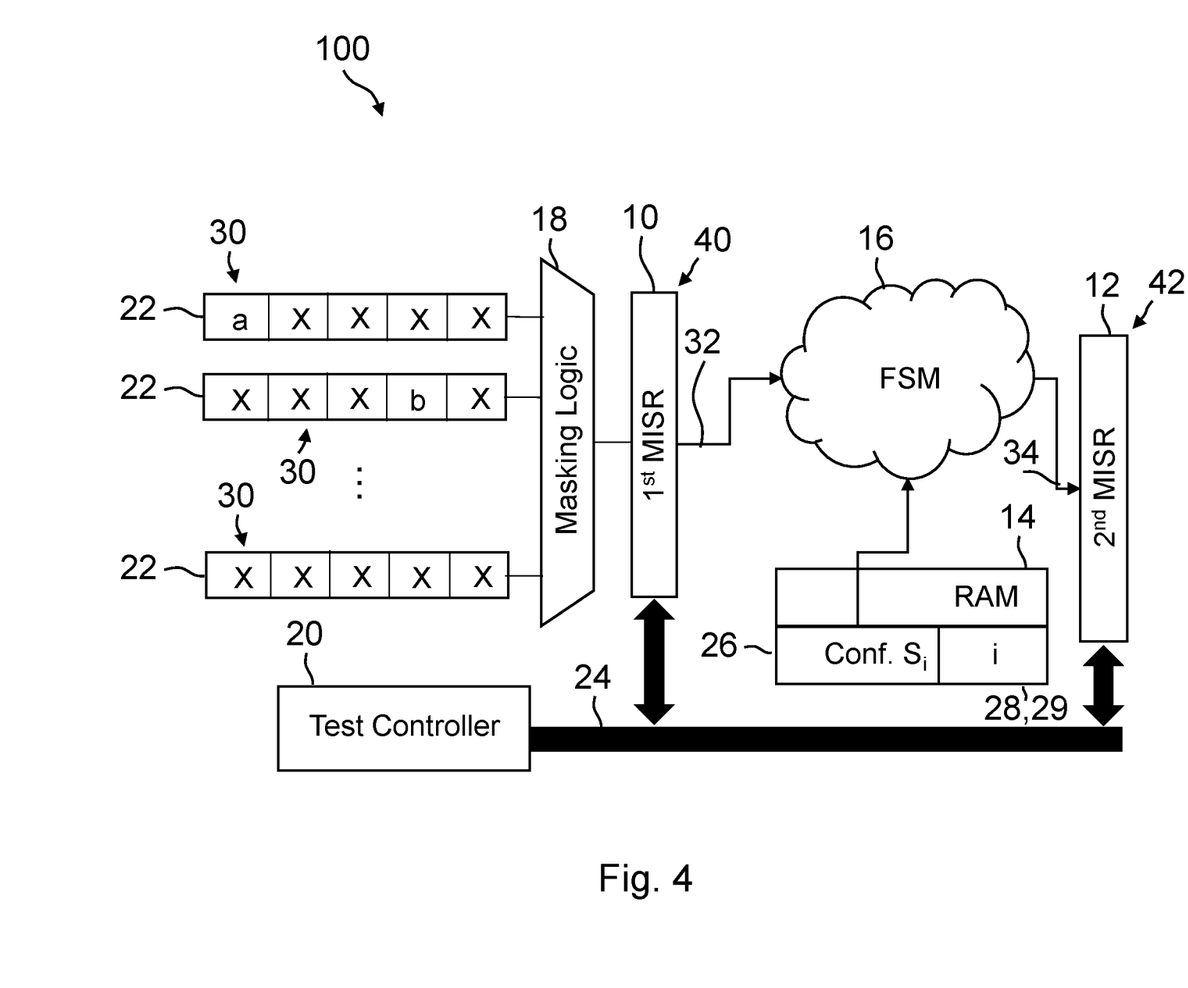
FIG. 4 depicts an apparatus for performing a logic built-in self-test of an electronic circuit operating on a clock cycle basis according to an embodiment of the invention.

FIG. 4 depicts an apparatus 100 for performing a logic built-in self-test of an electronic circuit operating on a clock cycle basis according to an embodiment of the invention.

The apparatus 100 comprises multiple scan chains 22 connected to a first multiple input signature register 10 (1st MISR).

The first signature register 10 is adapted to generate test signatures 40 from test patterns 30 automatically generated as input for the scan chains 22. A masking logic 18 is foreseen for scanning the test patterns 30 in the scan chains 22, triggered by the clock cycle, in order to compact the test patterns 30 into a single signature 40 in the first signature register 10. Yet, the proposed apparatus 100 would also work in the described manner without masking.

The apparatus 100 comprises a test controller 20 to provide to and to receive from the first signature register 10 control signals 24.

The apparatus 100 further comprises a random access memory 14, at least one second signature register 12, and a logic circuitry 16.

A configurable test signature 26 is stored in the random access memory 14 together with a pattern counter 28, 29 for a test pattern 30, wherein a number of second signature registers 12 corresponds to at least a number of entries in the random access memory 14. Thus the random access memory 14 may have fewer entries than the number of signature registers 12. But in any case, as many entries may be stored in the random access memory 14 as failures shall be detected. Thus the number of second signature registers 12 corresponds at least to a maximum number of faults to be identified by the test.

The logic circuitry 16, which may be implemented as a finite state machine, is further connected to the outputs 32 of the first signature register 10 and to the inputs 34 of the second signature register 12. The logic circuitry 16 is adapted to determine by a compare operation for a given test pattern 30 whether the test signature 40 in the first signature register 10 before a capture cycle of a next test pattern 30 differs from the corresponding configurable signature 26.

According to embodiments of the invention errors 54 shall be extracted at fixed test patterns 30 in the sequence, so that the errors 54 may be filtered out after all test patterns 30 have been applied.

In that case the logic circuitry 16 identifies an error 54, as exemplified in FIG. 3, as a result of the compare operation for this test pattern 30. As the compare operation an XOR operation may be used.

The logic circuitry 16 stores the error 54 into the second signature register 12 and triggers the test controller 20 to perform a next test using a next test pattern 30.

Then the logic circuitry 16 performs the compare operation of the test signature 40 in the first signature register 10 and the corresponding configurable signature 26, stores the error 54 in the second signature register 12 in case the test signature 40 in the first signature register 10 before the capture cycle of the next test pattern 30 differs from the corresponding configurable signature 26. Thus a failure is captured in the second signature register 12.

The procedure is repeated in a feedback loop until all test patterns 30 have been applied.

The logic circuitry 16 is configured to receive from and to provide control signals 24 to the test controller 20, wherein the test controller 20 is configured to receive from and provide control signals 24 to the logic circuitry 16.

Figure 5:
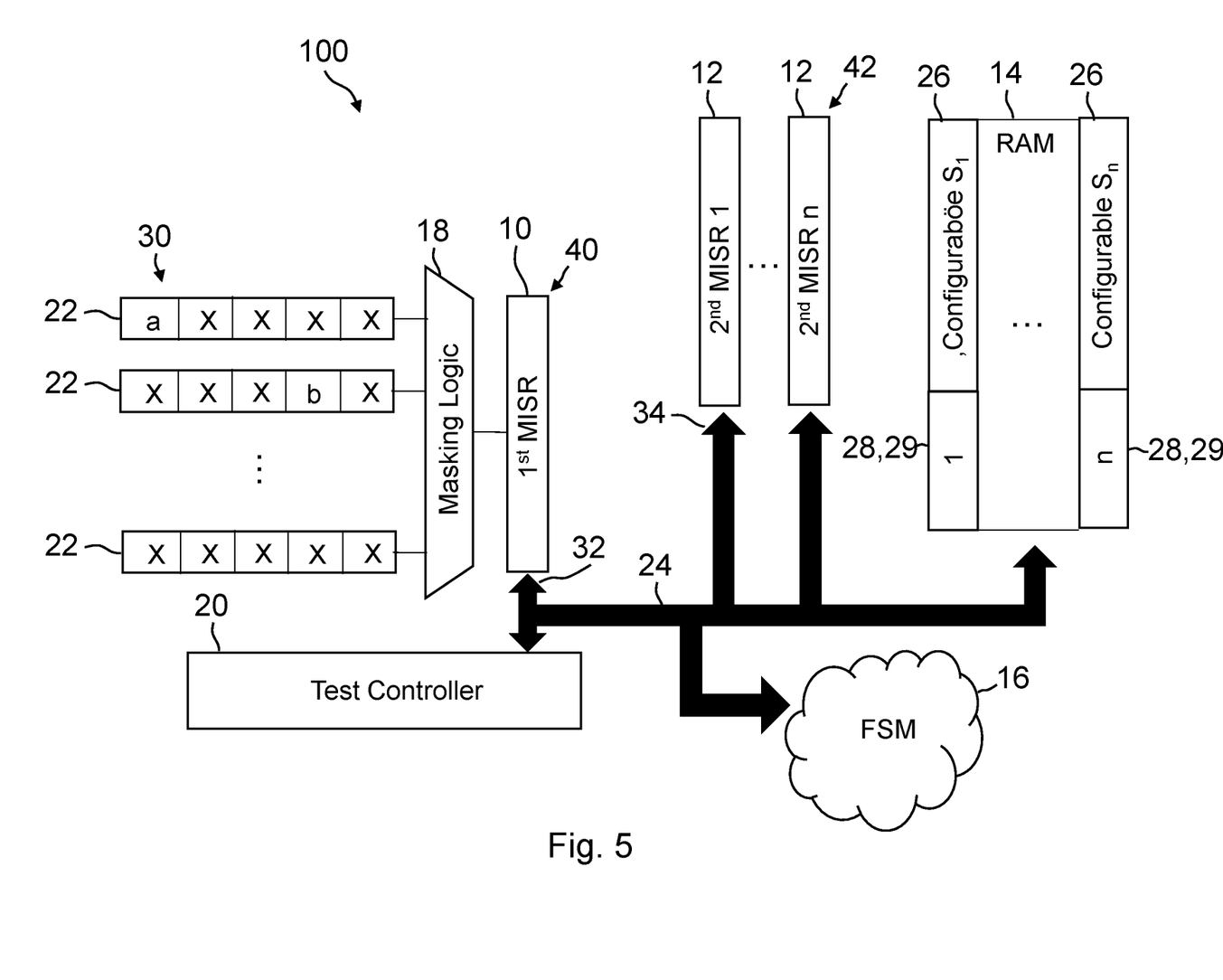
FIG. 5 depicts an apparatus for performing a logic built-in self-test of an electronic circuit operating on a clock cycle basis according to a further embodiment of the invention.

FIG. 5 depicts an apparatus 100 for performing a logic built-in self-test of an electronic circuit operating on a clock cycle basis according to a further embodiment of the invention.

Whereas the apparatus 100 shown in FIG. 4 is adapted to cover single failures in the LBIST, the embodiment shown in FIG. 5 is adapted to cover multiple failures.

Therefore the principal layout is the same as for the embodiment of FIG. 4, but the electronic circuit in FIG. 5 comprises a number of n second signature registers 12 corresponding to the number of the test patterns 30 to be generated automatically. The random access memory 14 also comprises a number of n configured signatures 26 with their corresponding pattern counts.

Figure 6:
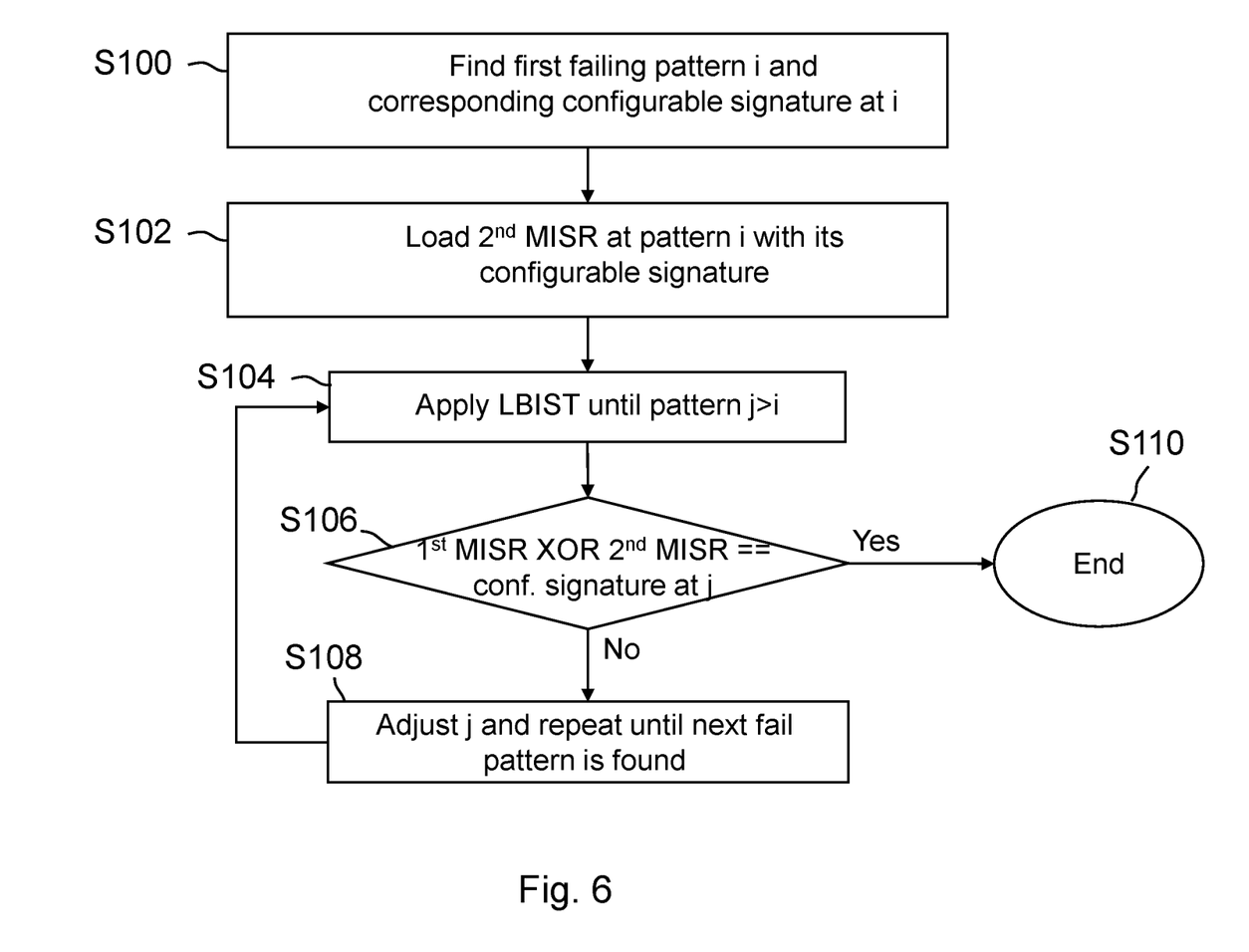
FIG. 6 depicts a flow chart for performing a logic built-in self-test with an apparatus according to FIG. 4.

FIG. 6 depicts a flow chart for performing a logic built-in self-test with an apparatus 100 according to FIG. 4.

The flow chart, which exemplifies the process for performing the logic built-in self-test for a single fault, is starting in step S100 by at least performing interval-based testing and finding a first failing test pattern 50 with a first pattern count 28 at index i and corresponding configurable signature 26 for this test pattern 50.

Next, in step S102, the second signature register 12 is loaded at the test pattern 50 with its configurable signature 26.

In step S104 the testing is continued until a second pattern count 29 which is greater than the first pattern count 28 is reached.

Then in step S106 it is checked if the test signature 40 in the first signature register 10 combined with the signature 42 stored in the second signature register 12 using the compare operation differs from the configurable signature 26 for the second pattern count 29.

If this is the case then, in step S108, the second pattern count 29 is adjusted and the testing is continued by going back to step S104 and the loop repeated until a next failing test pattern 52 is found.

Otherwise the testing is ended in step S110.

Figure 7:
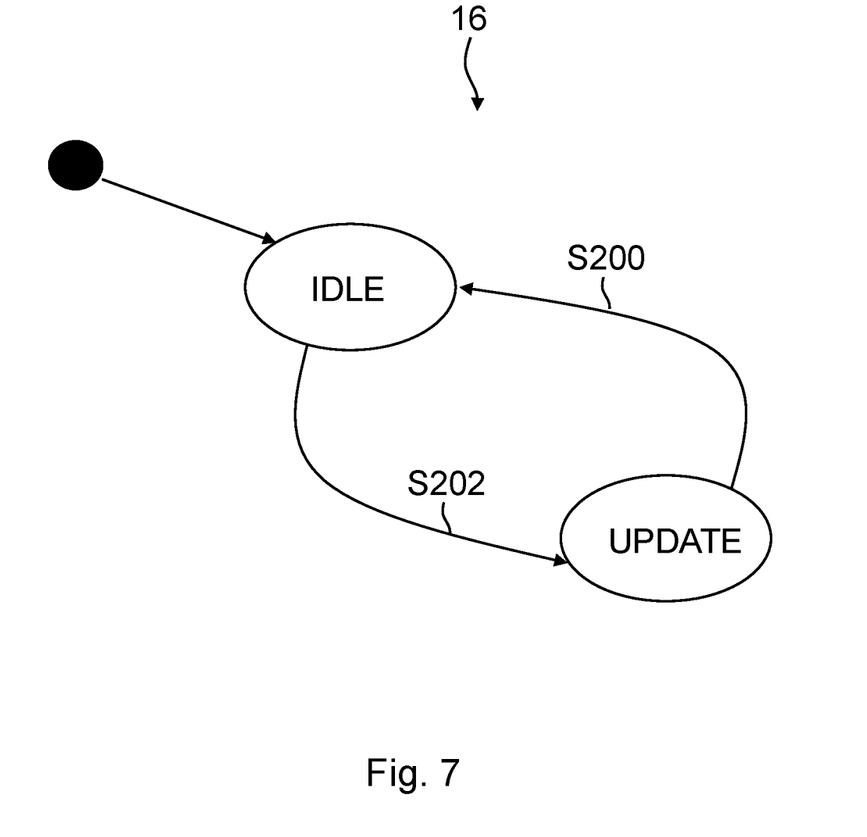
FIG. 7 depicts an operation of a logic circuitry according to an embodiment of the invention.

FIG. 7 depicts an operation of a logic circuitry 16 according to an embodiment of the invention.

First, the logic circuitry 16, which may be implemented as a finite state machine, starts in a wait state IDLE.

The logic circuitry 16 is configured to be triggered by the test controller 20 using a loop counter counting how many patterns 30 have been applied and a capture signal specifying whether to apply a system clock or a scan clock. This piece of circuitry is triggered when the loop counter reaches the next pattern 30 after the pattern count entry 28 in the random access memory 14 and the capture signal specifies that a capture clock should be applied. Upon being triggered, the logic circuitry 16 makes a transition S202 from the state IDLE to the state UPDATE. Upon being triggered, the second signature register 12 is updated in the transition S200 with the current error 54 if the observed signature 40 differs from the configured signature 26.

The second signature registers 12 in the random access memory 14 should contain the pattern counts 28 where errors are suspected to appear. They need to be available in memory before test application. After the test is applied one can check if an additional fault has appeared after the last second signature register 12 by aggregating all second signature registers 12 with the first signature register 10 and comparing the resulting signature with the fault free signature 44.

If the resulting signature is identical to the fault free signature 44 no additional error has appeared after the last second signature register 12. Otherwise, an additional second signature register 12 can be used to find the next error in the pattern sequence. This procedure can be used iteratively to assist test engineers in extracting the greatest amount of information out of a faulty test sequence.

Figure 8:
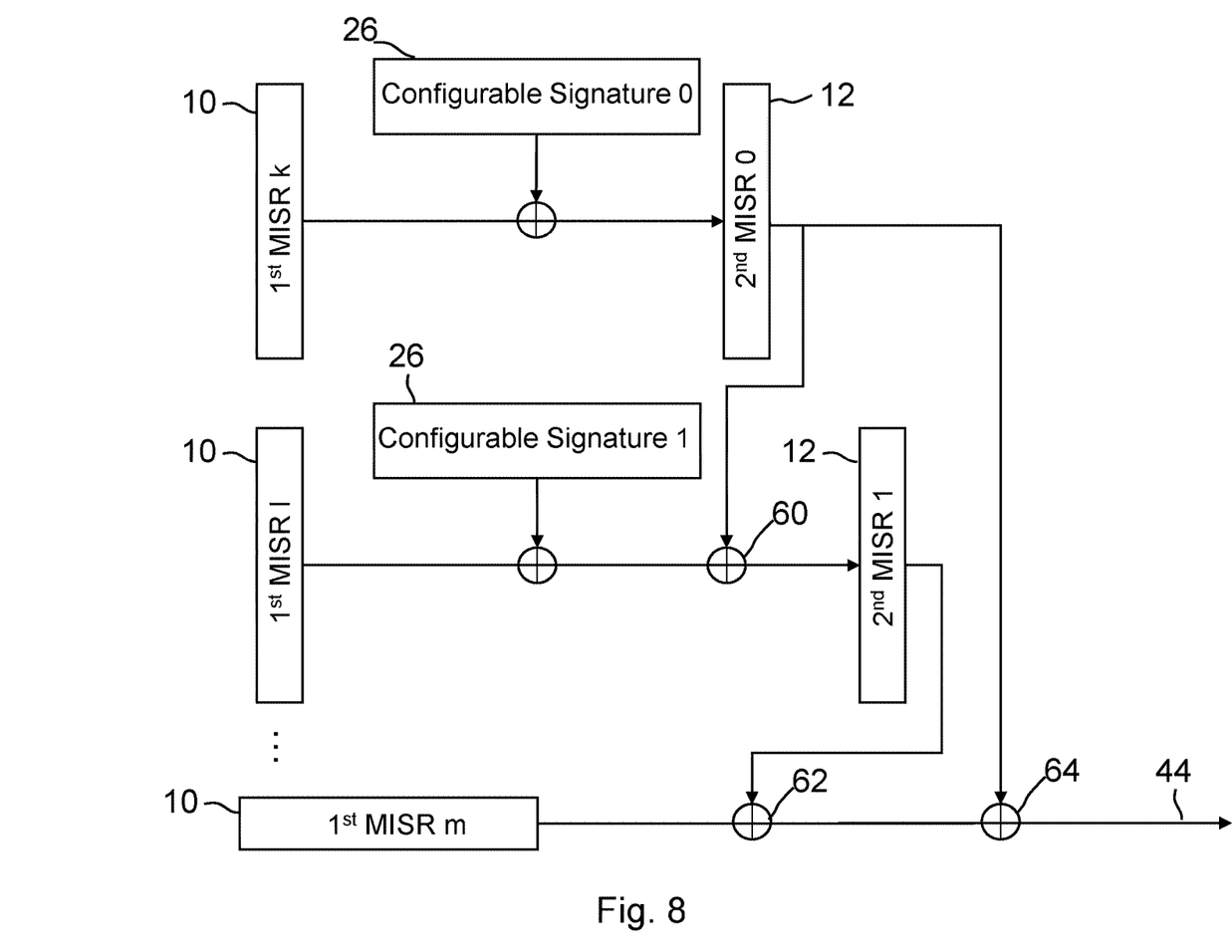
FIG. 8 depicts a flow diagram for performing a logic built-in self-test with an apparatus according to FIG. 5.

FIG. 8 depicts a flow diagram for performing a logic built-in self-test with an apparatus 100 according to FIG. 5.

For performing the logic built-in self-test for multiple faults, at least for a first pattern count 28 of a first failing test pattern 50 the test signature 40 of the first signature register 10 with index k is combined with the corresponding configurable signature 26 with index 0 using the compare operation and feeding the result to the corresponding second register 12.

For a second pattern count 29 of a next failing test pattern 52 the test signature 40 of the first signature register 10 with index 1 is combined with the corresponding configurable signature 26 with index 1 using the compare operation.

This result is combined with the content of the second signature register 12 with index 0 for the first failing test pattern 50 using the compare operation and the result 60 is fed to the corresponding second register 12 with index 1.

The content of the second signature register 12 with index 1 is also combined with the content of the first signature register 10 with index m in order to deliver signature 62, as well as combining the result of the second signature register 12 with index 0 with signature 62 in order to get signature 64.

The test signature 40 of the first signature register 10 for the following test patterns 30 is combined with the contents of the second registers 12 of previous failing test pattern counts 28, 29 using compare operations until a test pattern 30 with a corresponding fault-free signature 44 is passed without a fault.

Thus, the logic circuitry 16 is adapted for loading a current error 54 in a failed test pattern 50, 52, which is calculated by using the compare operation also on previous signatures 42 of failed test patterns 50, 52 stored in the second signature registers 12, to the current second signature register 12.

The current second signature register 12 is initialized with the error 54.

Upon completion of the logic built-in self-test it is checked for an additional fault by aggregating the second signature registers 12 with the first signature register 10 and comparing the resulting signature with the fault free signature 44.

Figure 9:
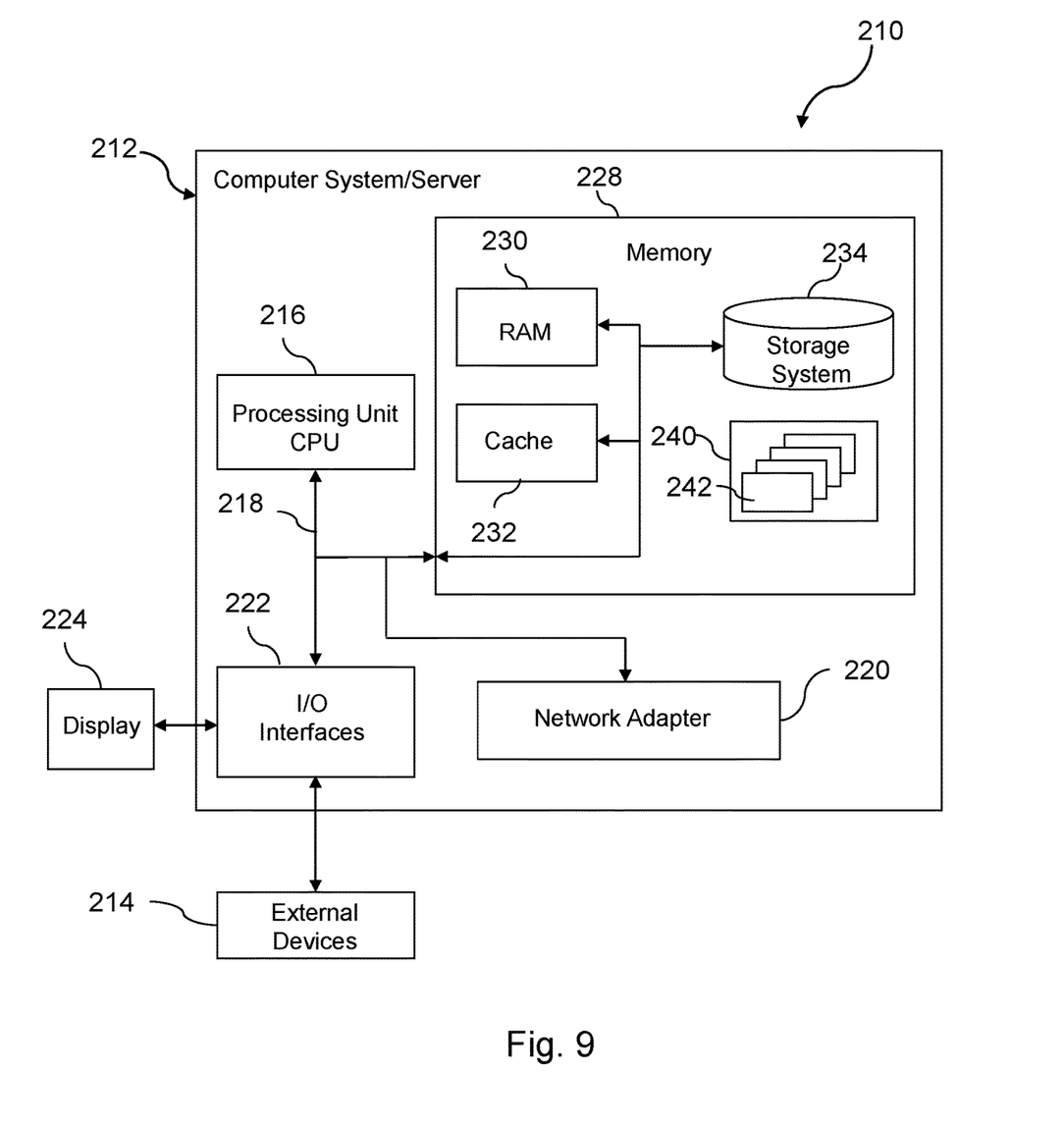
FIG. 9 depicts an example embodiment of a data processing system for executing a method according to the invention.

Referring now to FIG. 9, a schematic of an example of a data processing system 210 is shown. Data processing system 210 is only one example of a suitable data processing system and is not intended to suggest any limitation as to the scope of use or functionality of embodiments of the invention described herein. Regardless, data processing system 210 is capable of being implemented and/or performing any of the functionality set forth herein above.

In data processing system 210 there is a computer system/server 212, which is operational with numerous other general-purpose or special-purpose computing system environments or configurations. Examples of well-known computing systems, environments, and/or configurations that may be suitable for use with computer system/server 212 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, computer system/server 212 in data processing system 210 is shown in the form of a general-purpose computing device. The components of computer system/server 212 may include, but are not limited to, one or more processors or processing units 216, a system memory 228, and a bus 218 that couples various system components including system memory 228 to processing units 216.

Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 212 typically includes a variety of computer system readable media. Such media may be any available media that is accessible by computer system/server 212, and it includes both volatile and non-volatile media, removable and non-removable media.

System memory 228 can include computer system readable media in the form of volatile memory, such as random access memory (RAM) 230 and/or cache memory 232.

Computer system/server 212 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 218 by one or more data media interfaces. As will be further depicted and described below, memory 228 may include at least one program product having a set (e.g., at least one) of program modules that are configured to carry out the functions of embodiments of the invention.

Program/utility 240, having a set (at least one) of program modules 242, may be stored in memory 228 by way of example, and not limitation, as well as an operating system, one or more application programs, other program modules, and program data. Each of the operating system, one or more application programs, other program modules, and program data or some combination thereof, may include an implementation of a networking environment. Program modules 242 generally carry out the functions and/or methodologies of embodiments of the invention as described herein.

Computer system/server 212 may also communicate with one or more external devices 214 such as a keyboard, a pointing device, a display 224, etc.; one or more devices that enable a user to interact with computer system/server 212; and/or any devices (e.g., network card, modem, etc.) that enable computer system/server 212 to communicate with one or more other computing devices. Such communication can occur via Input/Output (I/O) interfaces 222. Still yet, computer system/server 212 can communicate with one or more networks such as a local area network (LAN), a general wide area network (WAN), and/or a public network (e.g., the Internet) via network adapter 220. As depicted, network adapter 220 communicates with the other components of computer system/server 212 via bus 218. It should be understood that although not shown, other hardware and/or software components could be used in conjunction with computer system/server 212. Examples include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language, and conventional procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special-purpose hardware-based systems that perform the specified functions or acts or carry out combinations of special-purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for performing a logic built-in self-test of an electronic circuit operating on a clock cycle basis, wherein the electronic circuit comprises one or more scan chains connected to a multiple input signature register, wherein the multiple input signature register generates test signatures in a first signature register utilizing test patterns generated as input for the one or more scan chains, and a test controller that provides control signals to and receives control signals from the first signature register, the apparatus comprising:
    a random-access memory, at least one additional signature register, and a logic circuitry;
    wherein a configurable test signature is stored in the random-access memory together with a pattern counter for a test pattern, wherein a number of the at least one additional signature register corresponds to a number of entries in the random access memory;
    wherein the logic circuitry is further connected to outputs of the first signature register and to inputs of the at least one additional signature register;
    wherein the logic circuitry determines an error by performing a compare operation for a given test pattern, the compare operation identifying that the test signature in the first signature register before a capture cycle of a next test pattern differs from the corresponding configurable test signature; and
    wherein the logic circuitry stores the error in a corresponding additional signature register.

2. The apparatus of claim 1, wherein the compare operation is an XOR operation.

3. The apparatus of claim 1, wherein the logic circuitry is configured to receive control signals from and to provide control signals to the test controller, wherein the test controller is configured to receive control signals from and provide control signals to the logic circuitry.

4. The apparatus of claim 1, wherein the logic circuitry is adapted for loading a current error in a failed test pattern, wherein the current error is calculated by using the compare operation on previous signatures of failed test patterns stored in the additional signature register, and the additional signature register is initialized with the current error.

5. The apparatus of claim 1, wherein the first signature register and/or the additional signature register are configured to generate test signatures from automatically generated test patterns by implementing a linear function depending on a generator polynomial for a given number of clock cycles.

6. The apparatus of claim 1, further configured to compact test patterns independently for generating the test signatures.

7. The apparatus of claim 1, wherein the electronic circuit further comprises a number of additional signature registers corresponding to a maximum number of faults to be identified by a self-test.

8. The apparatus of claim 1, wherein the logic circuitry is implemented as a finite state machine.

9. The apparatus of claim 8, wherein the logic circuitry is configured to be triggered by the test controller using a loop counter counting how many patterns have been applied and a capture signal specifying whether to apply a system clock or a scan clock.

10. The apparatus of claim 8, wherein the logic circuitry is configured to, upon being triggered, update the additional signature register with a corresponding error.

11. A method for performing a logic built-in self-test of an electronic circuit operating on a clock cycle basis, wherein the electronic circuit comprises one or more scan chains connected to a multiple input signature register, wherein the multiple input signature register generates test signatures in a first signature register utilizing test patterns generated as input for the one or more scan chains, and a test controller that provides control signals to and receives control signals from the first signature register, the method comprising:
    storing, by one or more computer processors, a configurable test signature in a random-access memory together with a pattern counter for a test pattern, wherein a number of the at least one additional signature register corresponds to a number of entries in the random access memory;
    determining, by the one or more computer processors, an error based, at least in part, on a compare operation for a given test pattern, wherein the compare operation determines whether the test signature in the first signature register before a capture cycle of a next test pattern differs from the corresponding configurable test signature; and storing, by the one or more computer processors, the error in a corresponding additional signature register.

12. The method of claim 11, wherein the compare operation is an XOR operation.

13. The method of claim 11, further comprising:

performing, by the one or more computer processors, interval-based testing to identify a first failing test pattern with a first pattern count and the corresponding configurable signature for this test pattern;

configuring, by the one or more computer processors, the additional signature register with the corresponding error;

applying, by the one or more computer processors, testing until a second pattern count which is greater than the first pattern count is reached; and responsive to a determination that the test signature in the first signature register combined with the signature stored in the additional signature register using the compare operation differs from the configurable signature for the second pattern count, adjusting, by the one or more computer processors, the second pattern count and repeating testing until a next failing test pattern is found.

14. The method of claim 11, further comprising:

combining, by the one or more computer processors, for a first pattern count of a first failing test pattern, the test signature of the first signature register with the corresponding configurable signature using the compare operation and feeding the result to the corresponding additional signature register;

combining, by the one or more computer processors, for a second pattern count of a next failing test pattern, the test signature of the first signature register with the corresponding configurable signature using the compare operation;

combining, by the one or more computer processors, a result with the content of the additional signature register for the first failing test pattern using the compare operation and feeding the result to the corresponding second register; and combining, by the one or more computer processors, the test signature of the first signature register for the test patterns with the contents of the additional registers of previous failing test pattern counts using compare operations until a test pattern with a corresponding fault-free signature is passed without a fault.

15. The method of claim 11, further comprising:

triggering, by the one or more computer processors, a test controller with a loop counter to count how many patterns have been applied and a capture signal specifying whether to apply a system clock or a scan clock.

16. The method of claim 11, further comprising:

updating, by the one or more computer processors, the additional signature register with the corresponding error.

17. The method of claim 11, further comprising:

calculating, by the one or more computer processors, a current error in a failed test pattern using the compare operation on previous signatures of failed test patterns stored in the additional signature registers and initializing the additional signature register with the current error.

18. The method of claim 11, further comprising:

checking, by the one or more computer processors, completion of the logic built-in self-test for an additional fault by aggregating the additional signature registers with the first signature register and comparing the resulting signature with a fault free signature.

19. A computer program product for performing a logic built-in self-test of an electronic circuit operating on a clock cycle basis, wherein the electronic circuit comprises one or more scan chains connected to a multiple input signature register, wherein the multiple input signature register generates test signatures in a first signature register utilizing test patterns generated as input for the one or more scan chains, and a test controller that provides control signals to and receives control signals from the first signature register, the computer program product comprising:

one or more computer readable storage media and program instructions stored on the one or more computer readable storage media, the stored program instructions comprising:

program instructions to store a configurable test signature in a random-access memory together with a pattern counter for a test pattern, wherein a number of the at least one additional signature register corresponds to a number of entries in the random access memory;

program instructions to determine, an error based, at least in part, on a compare operation for a given test pattern, wherein the compare operation determines whether the test signature in the first signature register before a capture cycle of a next test pattern differs from the corresponding configurable test signature; and program instructions to store the error in a corresponding additional signature register.

20. The computer program product of claim 19, further comprising:

program instructions to perform interval-based testing to identify a first failing test pattern with a first pattern count and the corresponding configurable signature for this test pattern;

program instructions to configure the additional signature register with the corresponding error;

program instructions to apply testing until a second pattern count which is greater than the first pattern count is reached; and program instructions to, responsive to a determination that the test signature in the first signature register combined with the signature stored in the additional signature register using the compare operation differs from the configurable signature for the second pattern count, adjust the second pattern count and repeating testing until a next failing test pattern is found.

\* \* \* \* \*